United States Patent
Ehrenreich et al.

(10) Patent No.: US 7,558,138 B1
(45) Date of Patent: Jul. 7, 2009

(54) BYPASS CIRCUIT FOR MEMORY ARRAYS

(75) Inventors: Sebastian Ehrenreich, Schoenau (DE); Werner Juchmes, Boeblingen (DE); Atnje Mueller, Boeblingen (DE); Silke Salewski, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/242,564

(22) Filed: Sep. 30, 2008

(51) Int. Cl.
*G11C 7/00* (2006.01)
(52) U.S. Cl. .......................... 365/201; 365/203; 365/63
(58) Field of Classification Search ................. 365/201, 365/203, 63
See application file for complete search history.

(56) References Cited

U.S. PATENT DOCUMENTS

| | | | |
|---|---|---|---|
| 6,650,582 B2 * | 11/2003 | Matsumoto et al. | ......... 365/201 |
| 7,088,627 B1 | 8/2006 | Bajwa et al. | |
| 2008/0056044 A1 | 3/2008 | Tomita | |
| 2008/0291763 A1 | 11/2008 | Mori et al. | |

* cited by examiner

*Primary Examiner*—Huan Hoang
(74) *Attorney, Agent, or Firm*—McGinn IP Law Group, PLLC

(57) ABSTRACT

A method for bypassing a memory array in a circuit having a global bit line, a test port configured to output a logic test, a memory portion connected to the global bit line via a word line, a header device being connected to the global bit line via a pre-charge signal, the header device being configured to recharge the global bit line. A gating signal is sent to a gating device connected to the header device. The gating device is switched to a test mode upon receipt of the gating signal. The bypass data signal is sent to an evaluating device connected to the gating device, the evaluating device being configured to output a logic test. The logic test is output through the test port upon receipt of bypass data signal.

1 Claim, 6 Drawing Sheets

BYPASS CIRCUIT FOR MEMORY ARRAYS

BACKGROUND OF THE INVENTION

1. Field of the Invention

The present invention generally relates to a method and apparatus for bypassing memory arrays and in particular a method and apparatus for bypassing memory arrays in a very large scale integration (VLSI) circuit without an additional logic element.

2. Description of the Related Art

Memory arrays occupy a large portion of conventional very large scale integration (VLSI) circuits. Besides the basic functionality of read and write operations, additional (supporting) functions are needed, especially for an in-system test of the memory itself or of the logic attached to it. One of these features is conventionally referred to as a write-around or bypass circuit. It is used to display data from a separate port at the output of the memory, without affecting the array content.

FIG. 1 illustrates a conventional logic path 100. Referring to FIG. 1, data is launched by scannable latch 110, fed through logic 120 and received at the end by another scannable latch 130. System tests can easily be performed using the scan chain of conventional path 100.

When arrays get involved in a logic cone (e.g., multiple arrays or logic elements feeding into the same receiving flip-flop), performing the logic test becomes more difficult. This difficulty increases even more so in the case the array does not contain a scannable latch at the output but is directly connected to some downstream logic. In this configuration, it becomes more difficult to apply appropriate test-vectors to the logic cone. For this case, the "bypass" or "write-around" feature is required. The bypass feature is used to display data from a separate port at the output of the memory, without affecting the array content. A well-known and widely used method for realizing this function is a multiplexor circuit, which is connected to the memory output.

FIG. 2 illustrates a conventional bypass circuit 200 having multiplexor 240. Referring to FIG. 2, array 210 and scannable latch 230 would require the bypass or write-around circuit or feature. The bypass is used to display data from a separate port at the output of the memory without affecting the array content. One conventional method includes adding multiplexor 240 to array 210 which is connected to the output of memory 260. But this conventional solution has some drawbacks such as the requirement of an additional logic element to be placed in the timing critical output path of memory 260 or that a timing behavior of the bypassed data is different to the read data.

Adding a multiplexor to the VLSI circuit has the disadvantages in that an additional logic element has to be placed in the timing critical output path of the memory. The increased delay caused by the multiplexor limits the achievable maximum operating frequency. Timing behavior of the bypassed data is different than that of the read data. This timing difference makes time sensitive testing of the down-stream logic almost impossible.

SUMMARY OF THE INVENTION

In view of the foregoing, and other, exemplary problems, drawbacks, and disadvantages of the conventional systems, it is an exemplary feature of the present invention to provide a method for bypassing a memory array in a circuit having a global bit line, a test port configured to output a logic test, a memory portion connected to the global bit line via a word line, a header device connected to the global bit line via a pre-charge signal, the header device configured to recharge the global bit line, the method including sending a gating signal to a gating device connected to the header device, switching the gating device to a test mode upon receipt of the gating signal, sending a bypass data signal to an evaluating device connected to the gating device, the evaluating device configured to output a logic test, and outputting the logic test through the test port upon receipt of bypass data signal.

The present invention provides a bypass feature for memory arrays. The proposed circuits minimize the impact on the read delay present in conventional circuit. Furthermore, the present invention provides a circuit that helps to mimic the regular functional mode read delay, because large portions of the regular read path are also used for the bypassed data.

This feature is important when the bypass feature is used for performance testing of the downstream logic which is attached to the array output. Finally, the present invention can be easily attached to existing memory designs, minimizing the required device count and device overhead.

BRIEF DESCRIPTION OF THE DRAWINGS

The foregoing and other purposes, aspects and advantages will be better understood from the following detailed description of an exemplary embodiment of the invention with reference to the drawings, in which.

DETAILED DESCRIPTION OF AN EXEMPLARY EMBODIMENT OF THE INVENTION

Figure 1:
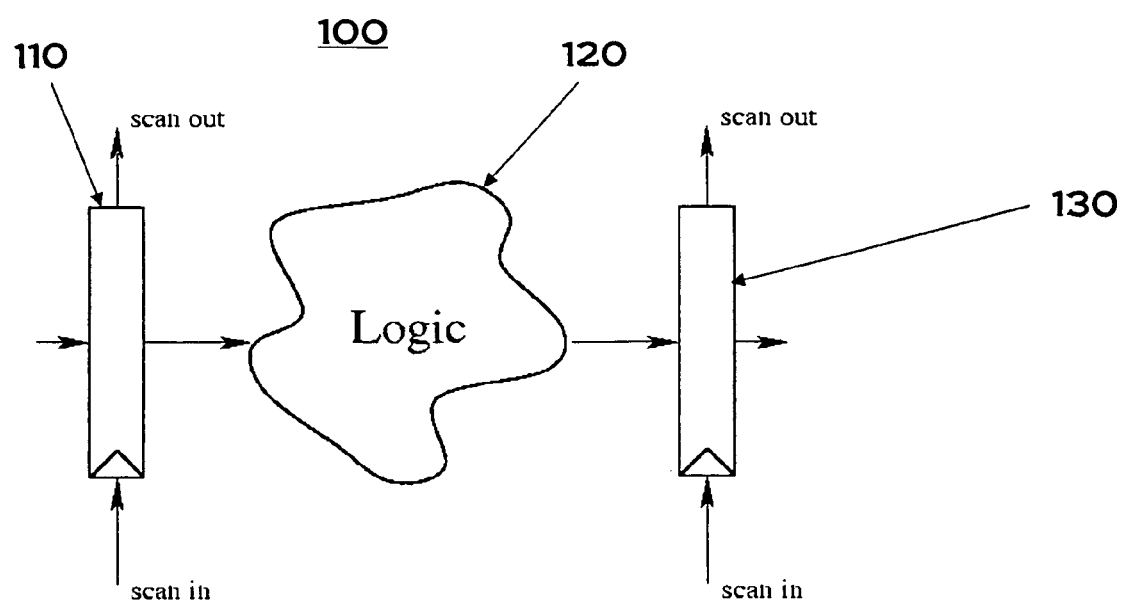
FIG. 1 illustrates a conventional logic path 100.
Figure 2:
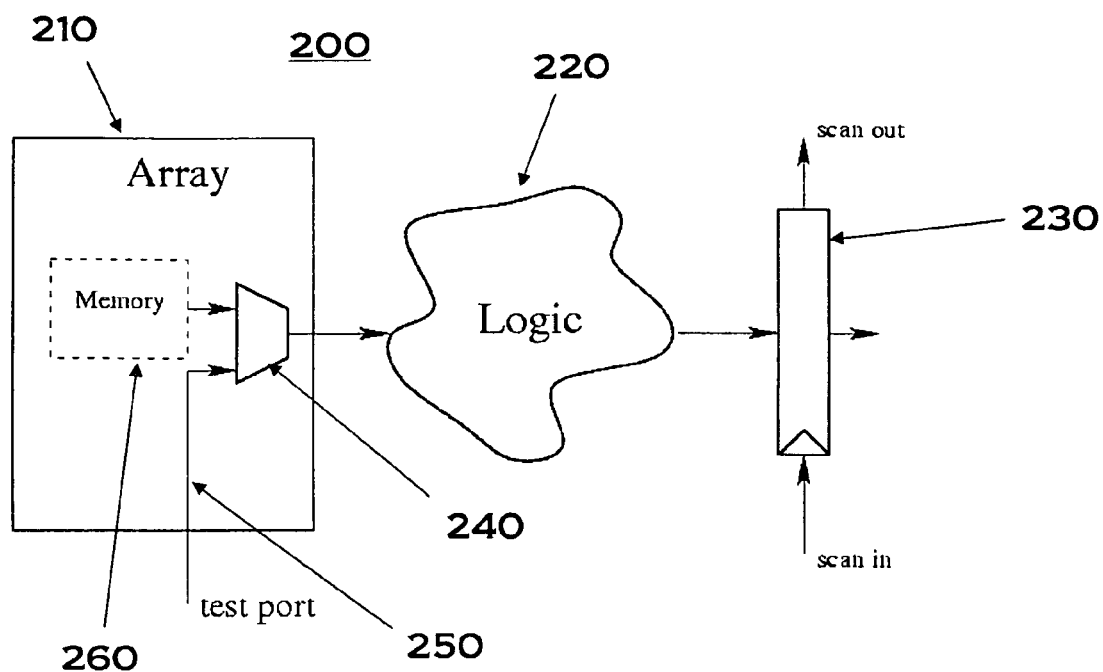
FIG. 2 illustrates a conventional bypass circuit 200.

Referring now to the drawings, and more particularly to FIGS. 3-6, there are shown exemplary embodiments of the method and structures according to the present invention.

Figure 3:
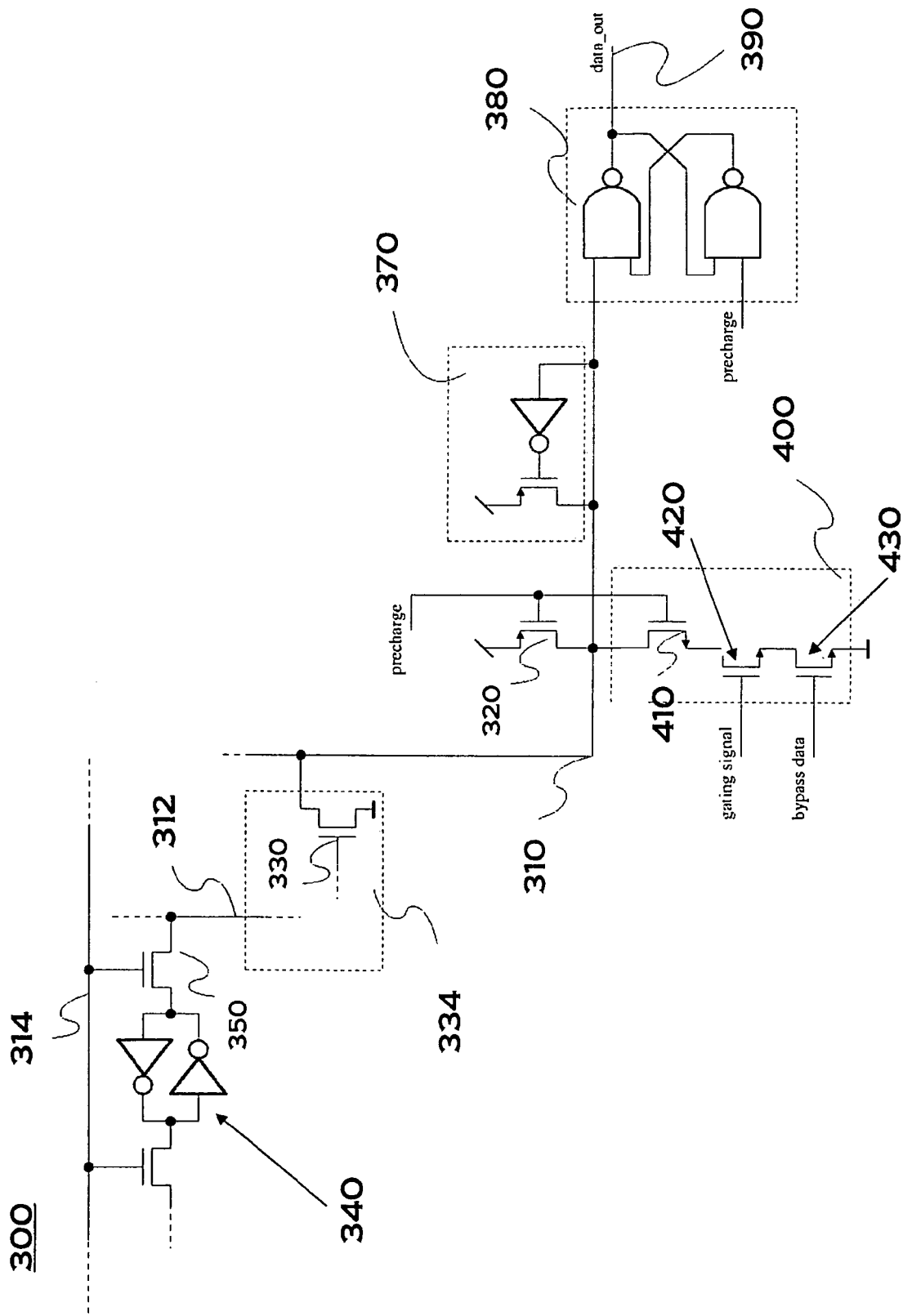
FIG. 3 illustrates an exemplary very large scale integrated circuit 300.

FIG. 3 illustrates very large scale integrated circuit 300, or VLSI circuit, according to an exemplary embodiment of the present invention. Referring to FIG. 3, circuit 300 would exemplarily include global bitline 310 of one memory column. Global bitline 310 is a dynamic node, which consists of pre-charge device 320 and evaluation devices 330. Evaluation devices 330 would exemplarily be a part of a local evaluation circuit (not illustrated) attached to the local bitline 312. Memory cells 340 are connected to local bitline 312 via pass-gate device 350, which is selected using word-line 314.

In some embodiments, keeper circuit 370 would exemplarily be added to the dynamic node for leakage protection. Global bitline readout circuit 380 may exemplarily be used to detect and store the global bitline level and would complete the circuit.

Exemplarily, in a regular array read operation the global bitline 310 will be discharged using the evaluation device 330 based on the selected memory cell 340 content using word-line 314, local bitline 312 and the local evaluation circuit 334. At the end of the read cycle, readout circuit 380 stores the state of the global bitline 310 and passes it to the output 390.

Exemplarily, evaluation leg 400 would be connected to global bitline 310 and would exemplarily be used for the memory bypass functionality. Evaluation leg 400 would exemplarily include gating device 410, an evaluation device 420 and a footer device 430.

Footer device 430 is connected to pre-charge device 320 and avoids excessive cross-currents, in case pre-charge device 320 and the gating device 410 and evaluation device 420 are switched on at the same time. The to-be-bypassed data is exemplarily applied to the evaluation device 420. Where a bypass operation occurs, gating device 410 would exemplarily be switched on, such as when a gating signal is sent and received by gating device 410, whereas all word-lines for the VLSI, such as word-line 314, would exemplarily be in an OFF state. That is, exemplarily, none of the memory cells (such as memory cell 340) is selected. Footer device 430 would be connected to global bit 310 line via a pre-charge signal sent by pre-charge device 320.

A bypass data signal is sent to evaluating device 420 and the evaluating device 420 outputs a logic test signal. Depending on the bypass input data, global bitline 310 is then discharged through evaluation device 420, the gating device 410, and the footer device 430.

Figure 4:
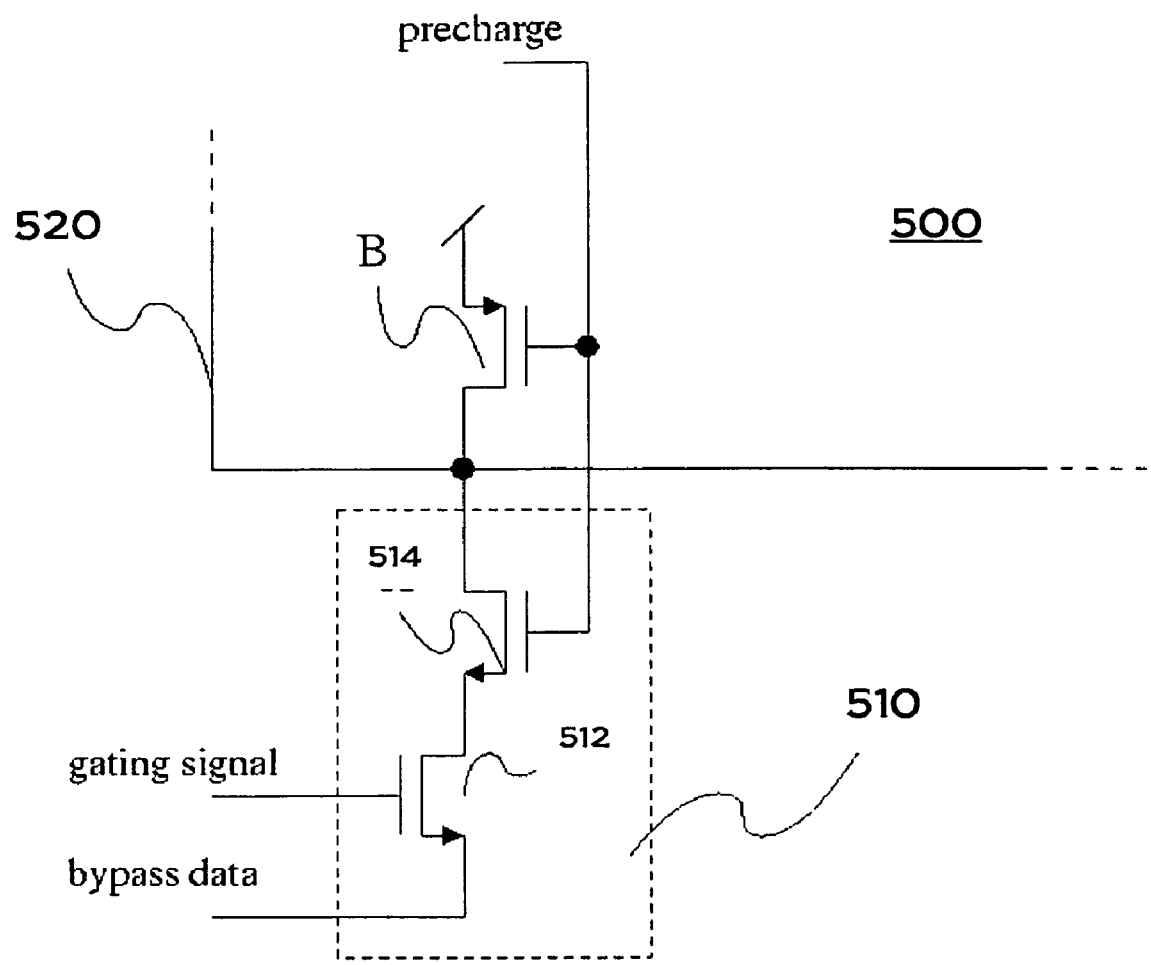
FIG. 4 illustrates another exemplary very large scale integrated circuit 500.

FIG. 4 is a diagram of another exemplary embodiment of a very large scale integrated circuit 500. Referring to FIG. 4, evaluation device 410 and gating device 420 of FIG. 3 are instead combined into a single bypass device 510. The gating signal is applied to the gate 512 of bypass device 510, whereas the to-be-bypassed data is applied to the source of device 514, or vice-versa. In bypass mode, bypass device 510 is switched on using the gating signal. A low level at the bypass data input will now discharge global bitline 520. A high-level will cause a voltage drop at global bitline 520, which would exemplarily not be enough to be detected as a low level by the bitline readout circuit 380 of FIG. 3.

Exemplarily, transistor 512 would possess both an evaluation and gating function of the exemplary embodiment illustrated by the gating device 410 and footer device 430. Device 514 and transistor 512 would form bypass device 510. The gating signal would be applied to the gate of transistor 512 and the to-be-bypassed data is applied to the source of transistor 512, or vice-versa. In the bypass mode, bypass device 510 would be switched on using the gating signal.

Figure 5:
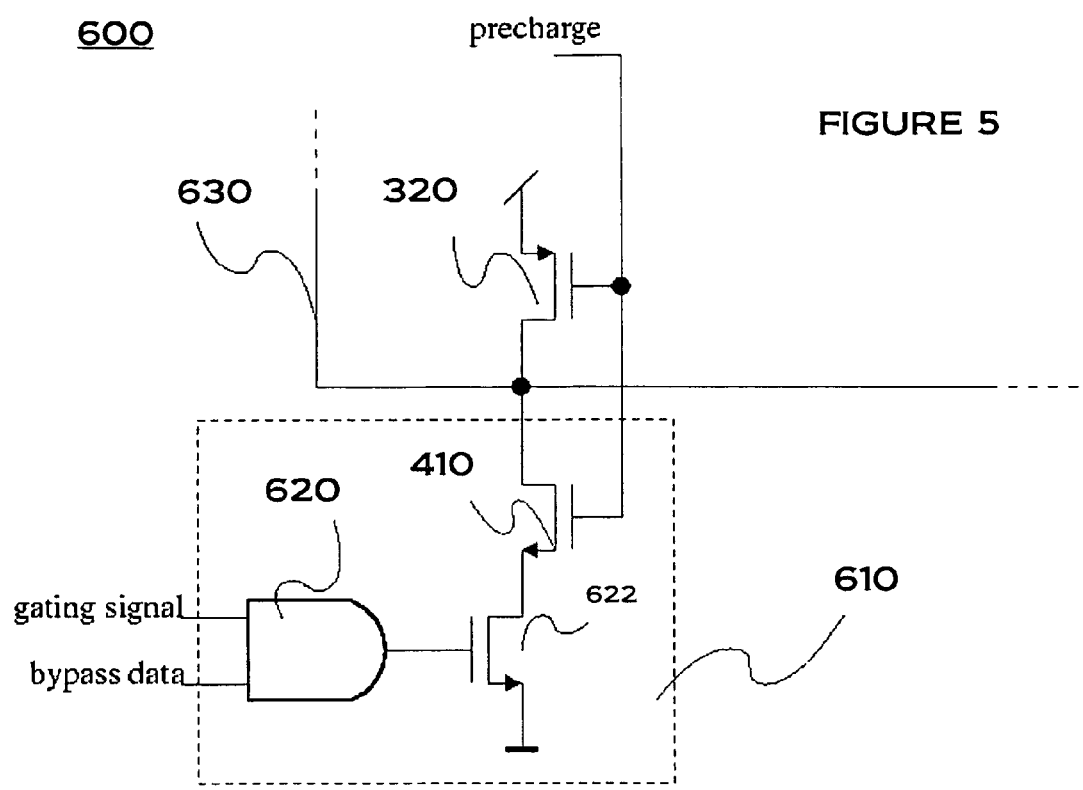
FIG. 5 illustrates another exemplary very large scale integrated circuit 600.

FIG. 5 illustrates another exemplary embodiment of very large scale integrated circuit 600. Referring to FIG. 5, circuit 600 includes bypass device 610. In bypass device 610, the evaluation and gating device are combined into transistor 620. Compared to the embodiment of FIG. 5, logic gate 630 is exemplarily connected to the gate 622 of transistor 620 to provide the gating function. A discharge of the global bitline 630 is only possible, when to-be-bypassed data and the gating signal are at high level, in all other cases transistor 620 remains in an OFF state. Bypass device 610 avoids the voltage drop described above for bypass device 500 illustrated in FIG. 5.

Figure 6:
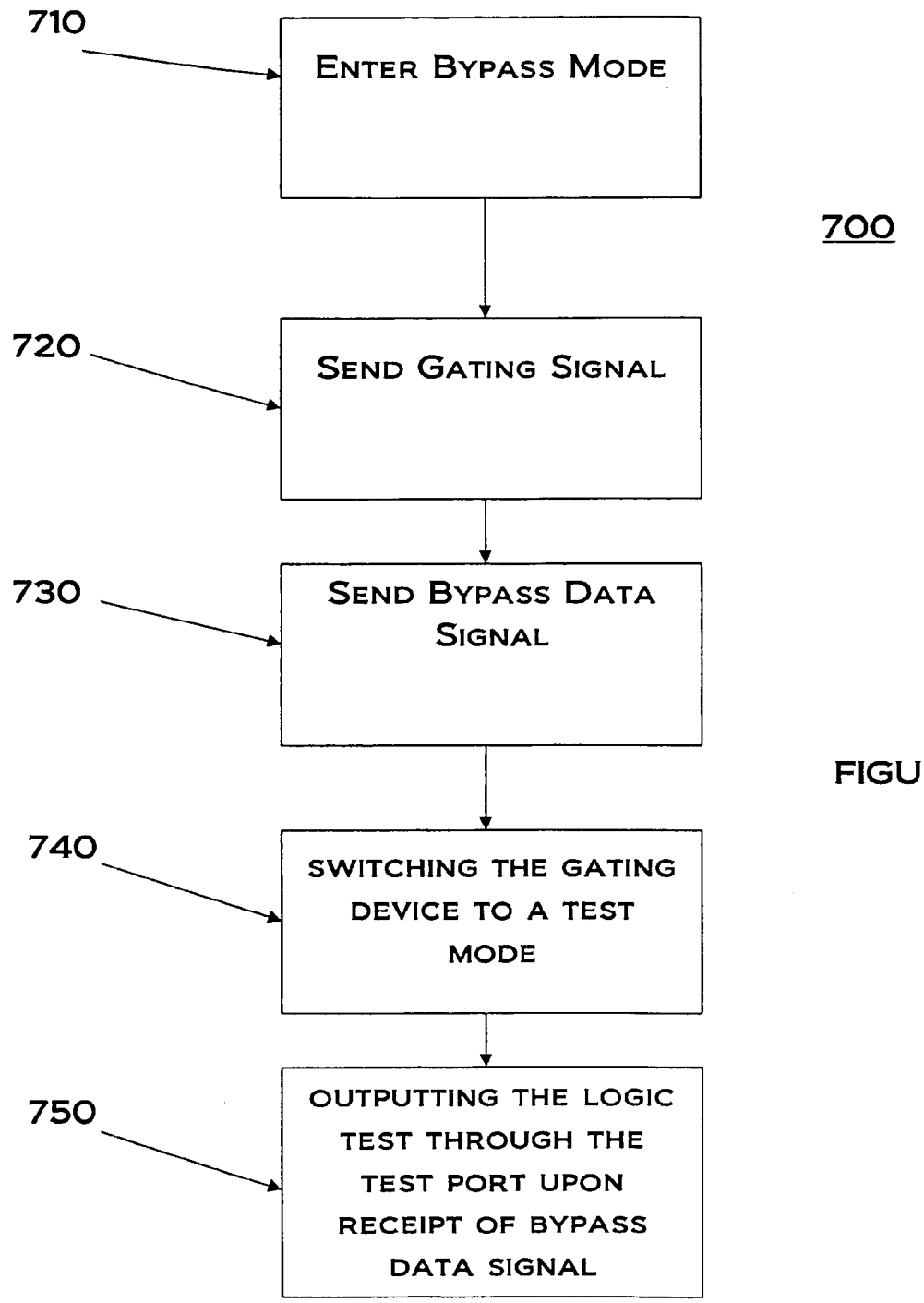
FIG. 6 illustrates an exemplary method of bypassing memory arrays 700.

FIG. 6 illustrates a method 700 for bypassing memory arrays. Referring to FIG. 6, a bypass mode is entered in Step 710. Upon entering the bypass mode, a gating signal is sent to a gating device connected to the header device in a circuit having a global bit line (e.g., a circuit as that illustrated in FIG. 3), a test port configured to output a logic test, a memory portion connected to the global bit line via a word line, a header device connected to the global bit line via a pre-charge signal, the header device configured to recharge the global bit line in Step 720. A bypass data signal is sent in Step 730 to the footer device. Upon receiving the gating signal, the gating device is switched to a test mode in Step 740. Upon receipt of the bypass data signal, the logic test is output through a test port in Step 750.

While the invention has been described in terms of exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

Having thus described our invention, what we claim as new and desire to secure by Letters Patent is as follows:

1. A method for bypassing a memory array, said method comprising:
   sending a gating signal to a gating device connected to a header device in a circuit having a global bit line, a test port configured to output a logic test, a memory portion connected to the global bit line via a word line, the header device being connected to the global bit line via a pre-charge signal, the header device being configured to recharge the global bit line;
   switching the gating device to a test mode upon receipt of the gating signal;
   sending a bypass data signal to an evaluating device connected to the gating device, the evaluating device being configured to output a logic test; and
   outputting the logic test through the test port upon receipt of the bypass data signal.

* * * * *